(12) United States Patent
Jeon et al.

(10) Patent No.: US 11,931,861 B2
(45) Date of Patent: Mar. 19, 2024

(54) WAFER GRINDING WHEEL

(71) Applicant: SAMSUNG ELECTRONICS CO., LTD., Suwon-si (KR)

(72) Inventors: Seong Gi Jeon, Hwaseong-si (KR); Sang Il Choi, Hwaseong-si (KR); Chang Su Jeong, Hwaseong-si (KR); Tae Gyu Kang, Hwaseong-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 1170 days.

(21) Appl. No.: 16/417,896

(22) Filed: May 21, 2019

(65) Prior Publication Data

US 2020/0198084 A1   Jun. 25, 2020

(30) Foreign Application Priority Data

Dec. 24, 2018   (KR) .......................... 10-2018-0168164

(51) Int. Cl.
*B24B 9/06* (2006.01)
*B24D 3/06* (2006.01)
*B24D 5/02* (2006.01)
*B24D 18/00* (2006.01)
*C01B 32/25* (2017.01)
*C09G 1/02* (2006.01)
(Continued)

(52) U.S. Cl.
CPC ................ *B24B 9/065* (2013.01); *B24D 3/06* (2013.01); *B24D 5/02* (2013.01); *B24D 18/0072* (2013.01); *C01B 32/25* (2017.08); *C09G 1/02* (2013.01); *C09K 3/1409* (2013.01); *C30B 29/04* (2013.01); *C30B 29/60* (2013.01); *C01P 2004/61* (2013.01); *C01P 2004/62* (2013.01)

(58) Field of Classification Search
CPC ...... B24B 9/065; B24D 18/0072; B24D 3/06; B24D 5/02; C01B 32/25; C01B 32/28; C01P 2004/54; C01P 2004/61; C01P 2004/62; C09G 1/02; C09K 3/1409; C30B 29/04; C30B 29/60
See application file for complete search history.

(56) References Cited

U.S. PATENT DOCUMENTS 9,920,452 B2   3/2018   Wang et al.
9,982,176 B2   5/2018   Dumm et al.
(Continued)

FOREIGN PATENT DOCUMENTS

CN   102123830 A   7/2011
CN   103702800 A   4/2014
(Continued)

OTHER PUBLICATIONS

"Office Action", KR Application No. 10-2018-0168164, dated Mar. 12, 2023, 5 pp.
(Continued)

*Primary Examiner* — Shuangyi Abu Ali
(74) *Attorney, Agent, or Firm* — Myers Bigel, P.A.

(57) ABSTRACT

A grinding wheel includes a plurality of wheel tips. The plurality of wheel tips include a plurality of diamond abrasive grains and a bonding material mixed with the diamond abrasive grains. The plurality of diamond abrasive grains have a ratio of a length in a long axis direction to a width in a short axis direction of 1:2.5 to 1:3.5 and includes edges or vertices having a grinding angle of 90° or less.

12 Claims, 3 Drawing Sheets

(51) Int. Cl.
*C09K 3/14* (2006.01)
*C30B 29/04* (2006.01)
*C30B 29/60* (2006.01)

(56) References Cited

U.S. PATENT DOCUMENTS

| | | | |
|---|---|---|---|
| 2001/0011004 A1* | 8/2001 | Yamaguchi | B24D 7/06 |
| | | | 451/548 |
| 2003/0032382 A1* | 2/2003 | Suzuki | B24D 7/10 |
| | | | 451/450 |
| 2005/0081456 A1 | 4/2005 | Ihara et al. | |
| 2011/0092137 A1 | 4/2011 | Ohishi et al. | |
| 2012/0227333 A1* | 9/2012 | Adefris | B24D 11/00 |
| | | | 451/526 |
| 2013/0000216 A1 | 1/2013 | Wang et al. | |
| 2013/0236725 A1 | 9/2013 | Yener et al. | |
| 2014/0148082 A1 | 5/2014 | Dumm et al. | |
| 2015/0052825 A1 | 2/2015 | Adefris | |
| 2016/0001422 A1 | 1/2016 | Meana-esteban et al. | |
| 2017/0066099 A1 | 3/2017 | Nakamura | |
| 2019/0022827 A1* | 1/2019 | Mao | H01L 21/561 |
| 2019/0249051 A1* | 8/2019 | Adefris | C09K 3/1409 |

FOREIGN PATENT DOCUMENTS

| | | |
|---|---|---|
| CN | 104136172 A | 11/2014 |
| CN | 104254429 A | 12/2014 |
| CN | 105358292 A | 2/2016 |
| CN | 106104766 A | 11/2016 |
| JP | 2008-155362 A | 7/2008 |
| KR | 10-2009-0078647 A | 7/2009 |
| KR | 10-1103146 B1 | 1/2012 |
| KR | 10-1118537 B1 | 2/2012 |
| KR | 20130107351 A | 10/2013 |
| KR | 10-1828867 B1 | 2/2018 |
| TW | I602650 B | 10/2017 |
| WO | 2011068714 A2 | 6/2011 |
| WO | 2012092590 A2 | 7/2012 |
| WO | 2018057558 A1 | 3/2018 |
| WO | 2018118695 A1 | 6/2018 |

OTHER PUBLICATIONS

"Chinese Office Action", corresponding to CN Application No. 201910680928.1, dated Apr. 6, 2023, 7 pp.

* cited by examiner

140

450

350

250

750

650

550

WAFER GRINDING WHEEL

CROSS-REFERENCE TO RELATED APPLICATION

This application claims priority under 35 USC § 119 to Korean Patent Application No. 10-2018-0168164, filed on Dec. 24, 2018 in the Korean Intellectual Property Office, the disclosure of which is incorporated herein by reference in its entirety.

FIELD OF THE INVENTION

Apparatuses consistent with example embodiments relate to a wafer grinding wheel.

BACKGROUND

Due to demands for compact and lightweight semiconductor devices, a technique for making a semiconductor device thinner may be required. A process of grinding an unnecessary rear portion of a wafer is performed before a package process in a semiconductor process. A silicon wafer may be subjected to rough grinding, fine grinding, and polishing. Meanwhile, in order to secure grinding quality, it is important to prevent a surface of a silicon wafer from being cracked during a grinding process.

SUMMARY

The example embodiments of the inventive concept are directed to providing a grinding wheel including diamond abrasive grains having a high aspect ratio and an angular shape.

According to example embodiments, there is provided a grinding wheel including a plurality of wheel tips. The plurality of wheel tips may include a plurality of diamond abrasive grains and a bonding material mixed with the diamond abrasive grains. The plurality of diamond abrasive grains may have a ratio of a width in a short axis direction to a length in a long axis direction of 1:2.5 to 1:3.5 and include edges or vertices having a grinding angle of 90° or less.

According to example embodiments, there is provided a grinding wheel including a plurality of wheel tips. The plurality of wheel tips may include a plurality of diamond abrasive grains and a bonding material mixed with the diamond abrasive grains. The plurality of diamond abrasive grains may have a triangular pyramidal shape, a ratio of a width of a bottom surface to a height of a triangular pyramid of 1:2.5 to 1:3.5, and an angle formed by edges tangent to each other at a vertex of 30° to 50°.

According to example embodiments, there is provided a grinding wheel including a plurality of wheel tips. The plurality of wheel tips may include a plurality of diamond abrasive grains and a bonding material mixed with the diamond abrasive grains. The plurality of diamond abrasive grains may have a ratio of a width in a short axis direction to a length in a long axis direction of 1:2.5 to 1:3.5 and a grain diameter of 10 μm to 50 μm.

DETAILED DESCRIPTION OF EXEMPLARY EMBODIMENTS

Figure 1:
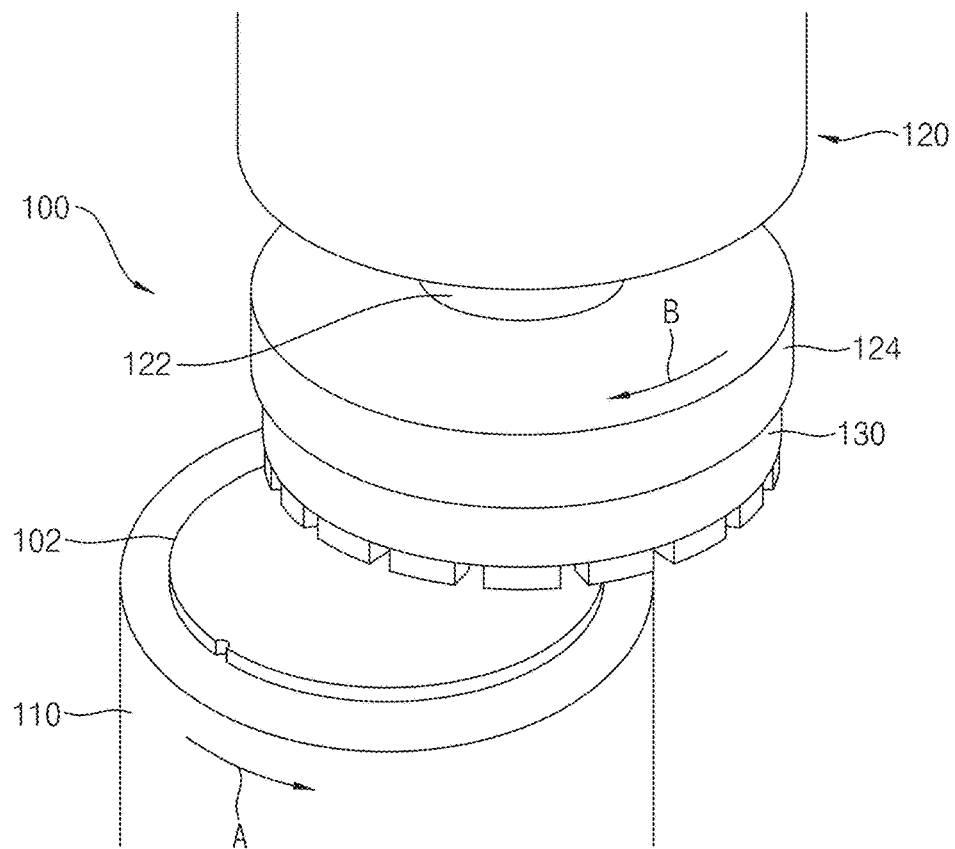
FIG. 1 is a perspective view showing a wafer grinding apparatus according to an example embodiment of the inventive concept.
Figure 2:
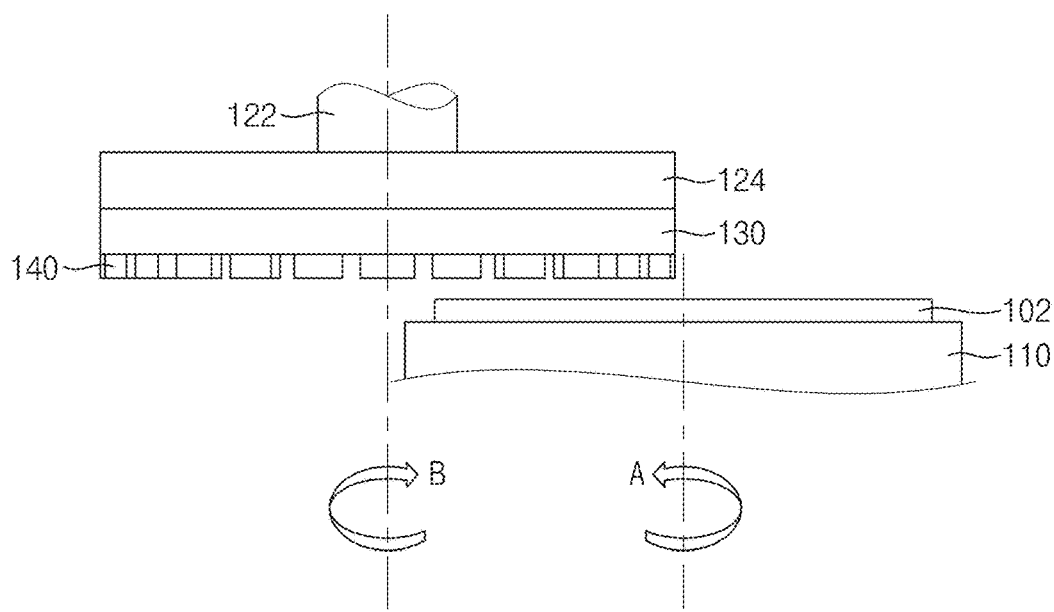
FIG. 2 is a side view of the wafer grinding apparatus according to the example embodiment of the inventive concept.

FIG. 1 is a perspective view showing a wafer grinding apparatus according to an example embodiment of the inventive concept. FIG. 2 is a side view of the wafer grinding apparatus according to the example embodiment of the inventive concept.

Referring to FIGS. 1 and 2, a wafer grinding apparatus 100 may include a substrate 102, a chuck table 110, and a spindle 120.

The substrate 102 may be disposed on the chuck table 110. The substrate 102 may be a silicon wafer used in a semiconductor process. In an example embodiment, the wafer grinding apparatus 100 may further include a protective film disposed between the substrate 102 and the chuck table 110. The protective film may be an ultraviolet curable adhesive tape in which an ultraviolet curable adhesive material is disposed on one surface of polyethylene, vinyl chloride, polyolefin, or the like.

The chuck table 110 may fix the substrate 102 to be ground, and a substrate rotating unit (not shown) may be connected to the chuck table 110 to rotate the substrate 102 at a predetermined speed in a predetermined direction. In an example embodiment, the chuck table 110 may have a porous surface and may support the substrate 102 thereon using a suction mechanism. In an example embodiment, the chuck table 110 may be disposed on an index table. The index table may include a plurality of chuck tables. For example, four chuck tables may be disposed on the index table. On the index table, the substrate 102 may be sequentially transferred to the plurality of chuck tables and may be subjected to primary grinding, secondary grinding, polishing, and unloading. In the chuck table shown in FIG. 1, a rough grinding process may be performed.

The spindle 120 may include a wheel rotating unit 122, a mount 124, and a grinding wheel 130. The spindle 120 is movable up and down and may grind the substrate 102 placed on the chuck table 110 by moving the grinding wheel 130 using the wheel rotating unit 122.

The wheel rotating unit 122 may be connected to an upper portion of the mount 124. The wheel rotating unit 122 may have a cylindrical shape and may rotate the grinding wheel 130 along a central shaft. A rotation direction of the wheel rotating unit 122 and a rotation direction of the substrate 102 may be opposite to each other. As shown in FIG. 2, the substrate 102 may be rotated in a first direction A and the wheel rotating unit 122 may be rotated in a second direction B which is opposite to the first direction A.

The mount 124 may be connected to a lower portion of the wheel rotating unit 122 and may fix the grinding wheel 130 disposed therebelow. The mount 124 may fix the grinding wheel 130 by means of a fastener such as a nut.

The grinding wheel 130 may be connected to a lower portion of the mount 124. The grinding wheel 130 may have a disc shape, a ring shape, a donut shape, or the like. The grinding wheel 130 may rotate in a predetermined direction in order to grind the substrate 102.

Figure 3:
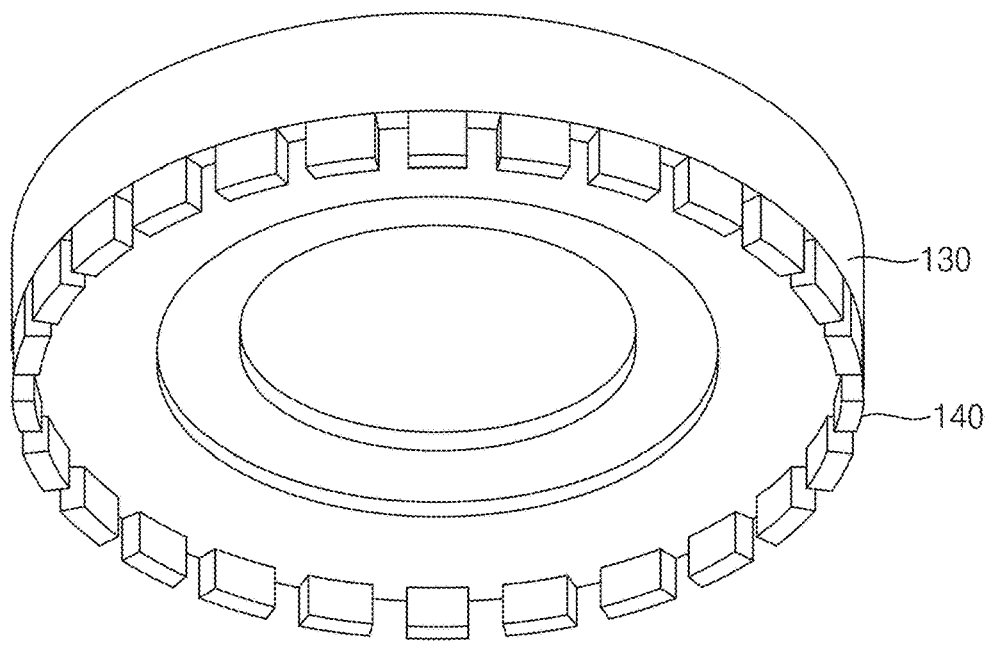
FIG. 3 is a bottom perspective view of the grinding wheel of FIG. 2.

A plurality of wheel tips 140 may be disposed below the grinding wheel 130 as illustrated in FIG. 3. The plurality of wheel tips 140 may be disposed along an edge of the grinding wheel 130 and circumferentially spaced apart from each other. The plurality of wheel tips 140 may have a rectangular parallelepiped shape having two curved surfaces perpendicular to a radial direction of the grinding wheel 130. The plurality of wheel tips 140 may be brought into contact with the substrate 102 to grind the substrate 102 at a predetermined speed. For example, the wheel tips 140 may grind the substrate 102 by about 1 to 10 μm per second.

Figure 4:
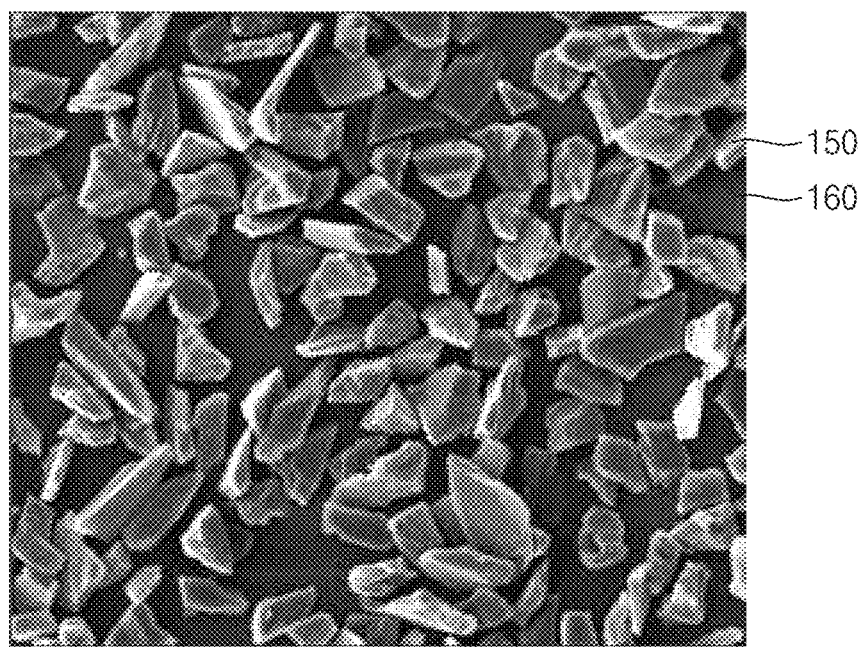
FIG. 4 is an enlarged view showing a wheel tip according to an example embodiment of the inventive concept.

FIG. 4 is an enlarged view showing a wheel tip 140 according to an example embodiment of the inventive concept.

Referring to FIG. 4, a wheel tip 140 may include abrasive grains 150 and a bonding material 160. The wheel tip 140 may further include pores between the plurality of abrasive grains 150 and inside the bonding material 160. The abrasive grains 150 may include, for example, diamond, cubic boron nitride (CBN), calcium carbonate, emery, novaculite, ferric oxide, ceramics, alumina, glass, silica, silicon carbide, or zirconia. In an example embodiment, the abrasive grains 150 may include diamond. The abrasive grains 150 may be disposed in the form mixed with the bonding material 160. For example, the bonding material 160 may surround the abrasive grains 150.

The abrasive grains 150 may be crushed monocrystalline diamond. In an example embodiment, the abrasive grains 150 may be crushed particles of polycrystalline natural diamond, sintered polycrystalline diamond, or polycrystalline artificial diamond. The abrasive grains 150 may be angular convex polyhedrons having various shapes. In an example embodiment, the abrasive grains 150 may be coated with a metal component such as Ni, Ag, Ti, or the like.

The plurality of abrasive grains 150 included in the wheel tip 140 may have an average grain size of 300 to 1,000 mesh. An aspect ratio of the abrasive grains 150 may range from 1:2.5 to 1:3.5. A degree of concentration of the abrasive grains 150 may range from 90 to 120. A degree of concentration of 100 means that the number of diamond carats contained per unit volume when an abrasive grain ratio calculated as vol % is 25% is 4.4 carat/cm$^3$. Here, one carat of diamond refers to about 0.2 g. When a grain diameter of one abrasive grain 150 is 30 μm on average, about six million abrasive grains 150 may be included in each wheel tip 140.

The bonding material 160 may serve as a filler which fills a space between the abrasive grains 150 and may bond the abrasive grains 150 to each other. The bonding material 160 may be partially detached together with debris of a workpiece and the abrasive grains 150 which are brought into contact with the workpiece during a grinding process. Since a portion of the bonding material 160 is detached from the wheel tip 140 together with the abrasive grains 150, a uniform grinding speed and grinding force may be maintained.

The bonding material 160 may include a resin bond, a metal bond, or a vitrified bond. In an example embodiment, the bonding material 160 may include a vitrified bond. For example, the resin bond may include a phenol resin, a urea-formaldehyde resin, a melamine-formaldehyde resin, a urethane resin, an acrylate resin, an aminoplast resin having a pendant α, β-unsaturated carbonyl group, an epoxy resin, or a thermosetting resin such as acrylated urethane, acrylated epoxy, bismaleimide, polyimide, cyanate ester, melamine, or the like.

The metal bond may include, for example, an alloy of bronze, copper, and zinc, cobalt, iron, nickel, silver, aluminum, indium, antimony, titanium, zirconium, and alloys thereof.

The vitrified bond may have a vitreous structure. The vitrified bond may include $Al_2O_3$, $TiO_2$, $ZrO_2$, $B_2O_3$, CaO, or ZnO with $SiO_2$ as a main component and may further include an alkali oxide such as $Li_2O$, $Na_2O$, or $K_2O$, an alkaline earth oxide such as CaO, MgO, or BaO, or the like.

In an example embodiment, the wheel tip 140 may further include a filler. The filler may be used as an auxiliary abrasive and may include silicon carbide (SiC), alumina ($Al_2O_3$), zirconia, mullite, ceria, or a combination thereof. The filler may grind the workpiece together with the abrasive grains 150 to make a surface of the workpiece more uniform and increase a surface roughness.

The size of a pore may be about 40 μm. When the abrasive grains 150 grind a workpiece such as the substrate 102, the abrasive grains 150 may be brought into contact with the workpiece to cut a portion of the workpiece. In order to increase grinding efficiency, some of the abrasive grains 150 which are brought into contact with the workpiece may be appropriately detached in the grinding process. The pores may secure a space between the abrasive grains 150 and inside the bonding material 160 to facilitate the detachment of the abrasive grains 150. The pores may easily discharge the debris generated during the grinding process to the outside and may allow a grinding solution to be uniformly supplied to a grinding surface so that a surface roughness of the workpiece may be improved. Further, since a contact area with the workpiece is reduced by an area occupied by the pores during grinding, grinding resistance may be reduced and the workpiece may be efficiently processed.

Figure 5:
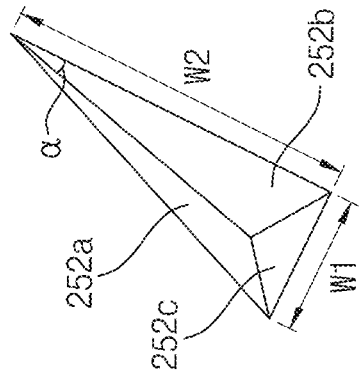
FIG. 5 is an enlarged view of a diamond abrasive grain according to an example embodiment of the inventive concept.

FIG. 5 is an enlarged view of a diamond abrasive grain according to an example embodiment of the inventive concept.

Referring to FIG. 5, an abrasive grain 250 may have a triangular pyramidal shape having a triangular bottom surface. The abrasive grain 250 may have a first side surface 252a, a second side surface 252b, and a third side surface 252c. The abrasive grain 250 may have a vertex and an edge at both ends in a long axis direction. The first side surface 252a, the second side surface 252b, and the bottom surface may be tangent to each other at the vertex, and the third side surface 252c and the bottom surface may be tangent to each other at the edge. Here, a long axis may refer to a longitudinal direction of the abrasive grain 250 and a short axis may refer to a thickness direction crossing the long axis. An aspect ratio of the abrasive grain 250 may range from 1:2.5 to 1:3.5. The aspect ratio may refer to a ratio of a maximum width of the abrasive grain 250 in a short axis W1 direction to a maximum length of the abrasive grain 250 in the long axis W2 direction.

A grinding angle of the abrasive grain 250 may be an acute angle. That is, the grinding angle of the abrasive grain 250 may be 90° or less and, for example, may range from 30° to 50°. Here, the grinding angle may refer to an angle formed by two edges at the vertex of the abrasive grain 250 or may refer to an angle formed by two surfaces at the edge of the abrasive grain 250. In an example embodiment, an angle of the first side surface 252a at the vertex and an angle α of the second side surface 252b at the vertex may be 90° or less.

A grain diameter of the abrasive grain 250 may range from 10 μm to 50 μm. The grain diameter may refer to a length of a diameter crossing the abrasive grain 250. For example, the grain diameter of the abrasive grain 250 may be 11 μm in the short axis W1 and 30 μm in the long axis W2.

The abrasive grain 250 according to the example embodiment of the inventive concept may include diamond and may be a crushed piece of natural diamond particle or artificial diamond particle. As shown in FIG. 5, since the abrasive grain 250 has a high aspect ratio of the long axis W2 to the short axis W1 and an angle of 90° or less at the vertex or edge, a contact area with the workpiece may be reduced so that a grinding speed may be increased. Further, shear stress applied to the workpiece during the grinding process may be reduced, and thus cracks on the surface of the workpiece may be prevented and suppressed and grinding quality may be improved. Therefore, the substrate 102 may be ground with a small load and the strength of the substrate 102 may be increased.

Figure 6:
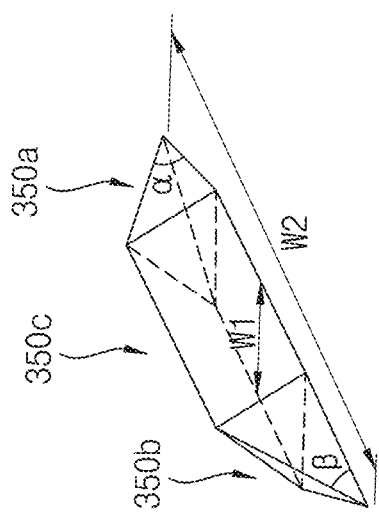
FIG. 6 is an enlarged view of an abrasive grain according to another example embodiment of the inventive concept.

FIG. 6 is an enlarged view of an abrasive grain 350 according to an example embodiment of the inventive concept.

Referring to FIG. 6, an abrasive grain 350 may have an elongated triangular bipyramidal shape. For example, the abrasive grain 350 may have a shape in which two triangular pyramids 350a and 350b are respectively attached to two surfaces of a triangular prism 350c, which are spaced apart from each other in a long axis direction. A grinding angle of the abrasive grain 350 may be 90° or less. Further, the abrasive grain 350 may include two or more edges or vertices having a grinding angle of 90° or less. For example, an angle α formed by two edges which meet at a vertex of the triangular pyramid 350a may be 90° or less. Further, an angle β formed by two edges which meet at a vertex of the triangular pyramid 350b may be 90° or less. A ratio of a width in a short axis W1 direction to a length in a long axis W2 direction may range from 1:2.5 to 1:3.5.

Figure 7:
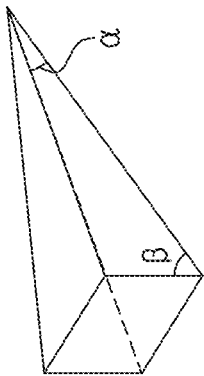
FIG. 7 is an enlarged view of an abrasive grain according to yet another example embodiment of the inventive concept.

FIG. 7 is an enlarged view of an abrasive grain 450 according to an example embodiment of the inventive concept.

Referring to FIG. 7, an abrasive grain 450 according to the example embodiment of the inventive concept may have a quadrangular pyramidal shape. The abrasive grain 450 may have a quadrangular bottom surface and four triangular side surfaces. The abrasive grain 450 may include two or more edges or vertices having a grinding angle of 90° or less. For example, an angle α formed by two edges which meet at a vertex at which the four side surfaces are tangent to each other may be 90° or less. An angle β formed by each of the four side surfaces and the bottom surface may be 90° or less.

Figure 8:
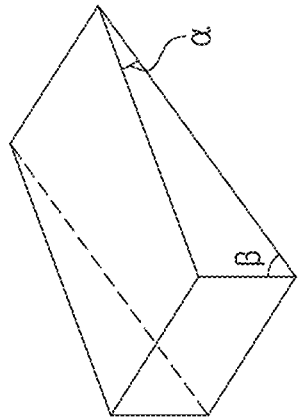
FIG. 8 is an enlarged view of an abrasive grain according to yet another example embodiment of the inventive concept.

FIG. 8 is an enlarged view of an abrasive grain 550 according to an example embodiment of the inventive concept.

Referring to FIG. 8, an abrasive grain 550 according to the example embodiment of the inventive concept may have a wedge shape. The abrasive grain 550 may have a quadrangular bottom surface, two quadrangular side surfaces, and two triangular side surfaces. The abrasive grain 550 may include two or more edges or vertices having a grinding angle of 90° or less. For example, an angle α formed by the two quadrangular side surfaces of the abrasive grain 550 may be 90° or less. An angle β formed by each of the two quadrangular side surfaces and the bottom surface may be 90° or less.

Figure 9:
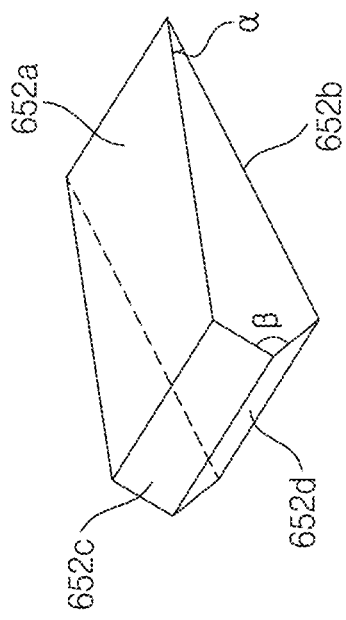
FIG. 9 is an enlarged view of an abrasive grain according to yet another example embodiment of the inventive concept.

FIG. 9 is an enlarged view of an abrasive grain 650 according to an example embodiment of the inventive concept.

Referring to FIG. 9, an abrasive grain 650 according to the example embodiment of the inventive concept may have an arrowhead shape. A rectangular first surface 652a and a rectangular second surface 652b may meet at a front end portion of an arrowhead. An angle α formed by the first surface 652a and the second surface 652b may be 90° or less. A rectangular third surface 652c and a rectangular fourth surface 652d may meet at a rear end portion of the arrowhead. An angle β formed by the third surface 652c and the fourth surface 652d may be 90° or less.

Figure 10:
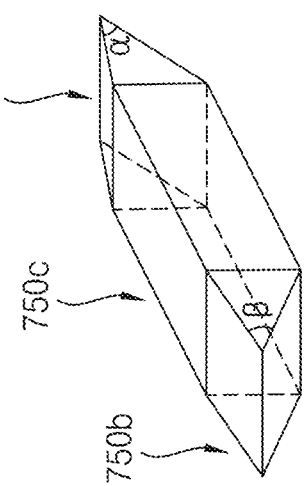
FIG. 10 is an enlarged view of an abrasive grain according to yet another example embodiment of the inventive concept.

FIG. 10 is an enlarged view of an abrasive grain 750 according to an example embodiment of the inventive concept.

Referring to FIG. 10, an abrasive grain 750 according to the example embodiment of the inventive concept may have a shape in which two quadrangular pyramids 750a and 750b are coupled to a quadrangular prism 750c. For example, the abrasive grain 750 may have a shape in which the quadrangular pyramids 750a and 750b are respectively attached to two surfaces of the quadrangular prism 750c, which face each other in a long axis direction. The abrasive grain 750 may include two or more edges or vertices having a grinding angle of 90° or less. For example, an angle α formed by two surfaces which meet at an edge of the quadrangular pyramid 750a may be 90° or less. Further, an angle β formed by two surfaces which meet at an edge of the quadrangular pyramid 750b may be 90° or less.

Hereinafter, a method of manufacturing a wheel tip 140 according to the example embodiment of the inventive concept will be described in accordance with a process sequence. The method of manufacturing a wheel tip 140 may include a grinding process in which diamond particles are broken into small pieces, a mixing process in which the ground abrasive grains 150 are mixed with the bonding material 160 or the like, a sintering process in which a mixture of the abrasive grain 150 and the bonding material 160 are sintered, and a processing process in which the sintered mixture is processed in a shape of the wheel tip 140.

The abrasive grains 150 may be formed by breaking natural diamond or artificial diamond into small particles by the grinding process. In an example embodiment, the grinding process may include a ball milling process. For example, diamond may be placed on a steel ball mill port and rotated at a predetermined speed. The ball milling process may include vibrating ball milling, streamline ball milling, cylindrical ball milling, or centrifugal ball milling. In an example embodiment, the grinding process may include grinding, roller milling, roll compression milling, hammer milling, cutting, compact milling, or jet milling.

A grain diameter of the ground abrasive grain 150 may range from 10 μm to 50 μm. The abrasive grains 150 may have an angular polyhedral shape. For example, the abrasive grain 150 may have a triangular pyramidal shape, a quadrangular pyramidal shape, an elongated triangular pyramidal shape, a wedge shape, or an arrowhead shape. Meanwhile, an angular polyhedral shape is not limited thereto. A grinding angle of the abrasive grain 150 may be 90° or less and, for example, may range from 30° to 50°.

The ground abrasive grains 150 and the bonding material 160 may be mixed. The bonding material 160 may include a resin bond, a metal bond, or a vitrified bond. In an example embodiment, the bonding material 160 may include a vitrified bond. The vitrified bond may include $Al_2O_3$, $TiO_2$, $ZrO_2$, $B_2O_3$, CaO, or ZnO with $SiO_2$ as a main component. The abrasive grains 150 and the bonding material 160 may be appropriately mixed such that a degree of concentration of the abrasive grains 150 ranges from 90 to 120.

In an example embodiment, a porosity material and a filler may also be mixed with the bonding material 160. Naphthalene, sugar, dextrin, polysaccharide oligomers, or butyl carbamate may be used as the porosity material. The filler may be used as an auxiliary abrasive and may include silicon carbide (SiC), alumina ($Al_2O_3$), zirconia, mullite, ceria, or a combination thereof. First, the bonding material 160 may be mixed with the porosity material and the filler and then the abrasive grains 150 may be mixed therewith at a certain ratio.

A mixture of the abrasive grains 150 and the bonding material 160 and the like may be sintered at a predetermined temperature. A mold, which has a predetermined shape, may be filled with the mixture before the mixture is sintered. In an example embodiment, the mixture may be sintered at a temperature of 400 to 900° C., but the inventive concept is not limited thereto, and the temperature may vary according to materials and a composition ratio of the bonding material 160, the filler, and the like which are added. Further, the mixture may be appropriately pressed during the sintering process. Nitrogen gas may be introduced to prevent oxidation of the abrasive grains 150 during the sintering process. The abrasive grains 150 may be firmly bonded to the bonding material 160 by the sintering process. The porosity material may provide pores therein. For example, when naphthalene is used as the porosity material, the naphthalene may be vaporized during the sintering process to form the pores in an inner side of the bonding material 160.

The sintered mixture may be separated from the mold. The mixture may then be processed in a shape of the wheel tip 140. In an example embodiment, the wheel tip 140 may be a rectangular parallelepiped in which two facing surfaces are curved.

According to the method of manufacturing the wheel tip 140 described above, the abrasive grains 150 are subjected to the grinding process so that the abrasive grains 150 may have an angular polyhedral shape. Since the grinding angle of the abrasive grains 150 which are brought into contact with the workpiece during the grinding process is 90° or less, a grinding speed and grinding quality may be improved. Since the bonding material 160 including the vitrified bond is detached from the wheel tip 140 together with the abrasive grains 150 during the grinding process, the grinding quality may be constantly maintained.

According to the example embodiments of the inventive concept, a grinding wheel can include diamond abrasive grains having a high aspect ratio and an angular shape to prevent cracking of a silicon wafer and improve grinding quality.

While the embodiments of the inventive concept have been described with reference to the accompanying drawings, it should be understood by those skilled in the art that various modifications may be made without departing from the scope of the inventive concept and without changing essential features thereof. Therefore, the above-described embodiments should be considered in a descriptive sense only and not for purposes of limitation.

What is claimed is:

1. A grinding wheel comprising a plurality of wheel tips, wherein:
    the plurality of wheel tips comprise a plurality of diamond abrasive grains and a bonding material mixed with the diamond abrasive grains; and
    the plurality of diamond abrasive grains have a ratio of a width in a short axis direction to a length in a long axis direction of 1:2.5 to 1:3.5, comprise edges or vertices having a grinding angle of 90° or less, and have an elongated triangular bipyramidal shape.

2. The grinding wheel of claim 1, wherein a degree of concentration of the plurality of diamond abrasive grains ranges from 90 to 120.

3. The grinding wheel of claim 1, wherein the grinding angle of the plurality of diamond abrasive grains ranges from 30° to 50°.

4. The grinding wheel of claim 1, wherein the plurality of wheel tips further comprise pores in an inner side of the bonding material.

5. The grinding wheel of claim 4, wherein a size of each of the pores is about 40 μm.

6. The grinding wheel of claim 1, wherein the bonding material comprises a vitrified bond.

7. The grinding wheel of claim 1, wherein an average grain size of the plurality of diamond abrasive grains ranges from 300 to 1,000 mesh.

8. The grinding wheel of claim 1, wherein a ratio of diamond abrasive grains comprising at least two edges or vertices having a grinding angle of 90° or less among the plurality of diamond abrasive grains is 80% or more.

9. The grinding wheel of claim 1, wherein the plurality of wheel tips are circumferentially spaced apart along an edge of the grinding wheel.

10. The grinding wheel of claim 1, wherein about six million abrasive grains are included in each wheel tip.

11. A grinding wheel comprising a plurality of wheel tips, wherein:
    the plurality of wheel tips comprise a plurality of diamond abrasive grains and a bonding material mixed with the diamond abrasive grains; and
    the plurality of diamond abrasive grains have a ratio of a width in a short axis direction to a length in a long axis direction of 1:2.5 to 1:3.5, a grain diameter of 10 μm to 50 μm, and an elongated triangular bipyramidal shape.

12. The grinding wheel of claim 11, wherein the bonding material comprises a vitrified bond.

* * * * *